(12) United States Patent
Yang

(10) Patent No.: US 8,624,879 B2
(45) Date of Patent: Jan. 7, 2014

(54) ROTATION SENSING DEVICE AND PORTABLE ELECTRONIC DEVICE HAVING THE SAME

(75) Inventor: Song-Ling Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1051 days.

(21) Appl. No.: 12/643,995

(22) Filed: Dec. 21, 2009

(65) Prior Publication Data

US 2011/0032218 A1    Feb. 10, 2011

(30) Foreign Application Priority Data

Aug. 7, 2009   (CN) .......................... 2009 1 0305358

(51) Int. Cl.
*G06F 3/03* (2006.01)
(52) U.S. Cl.
USPC ............................................ 345/184; 341/35

(58) Field of Classification Search
USPC .............. 345/184; 341/35; 340/686.1, 686.3; 321/661
See application file for complete search history.

(56) References Cited

U.S. PATENT DOCUMENTS 6,483,321 B2    11/2002   Brasseur
2004/0041572 A1*  3/2004  Lin et al. ...................... 324/661

* cited by examiner

*Primary Examiner* — LaTanya Bibbins
(74) *Attorney, Agent, or Firm* — Altis Law Group, Inc.

(57) ABSTRACT

A rotation sensing device comprises a capacitor module comprising an upper substrate and a lower substrate. The upper substrate comprises a plurality top plates mounted thereon, and the lower substrate comprises a plurality bottom plates mounted thereon. A pointing module comprises a pointer rotatably set between an upper substrate and a corresponding lower substrate. The pointer comprises a first portion. A detection circuit is electronically connected to the top plates and the bottom plates, and is configured for detecting pulses caused by a change of the capacitance resulting from movement of the first portion, determining a position change of the first portion relative to the initial position according the detected pulses, and determining a rotation orientation of the capacitor module according to the determined position change.

12 Claims, 6 Drawing Sheets

ROTATION SENSING DEVICE AND PORTABLE ELECTRONIC DEVICE HAVING THE SAME

BACKGROUND

1. Technical Field

The present disclosure relates to a sensing device, and especially relates to a rotation sensing device and a portable electronic device using the rotation sensing device.

2. Description of Related Art

Generally, electronic devices, such as, mobile phones, include a game function. Users operate direction keys to control movement of objects on a display of the electronic device when playing the game. However, when playing a race game, it difficult to accurately rotate or turn objects on the display with just the direction keys.

Therefore, there is room for improvement within the art.

DETAILED DESCRIPTION

Figure 1:
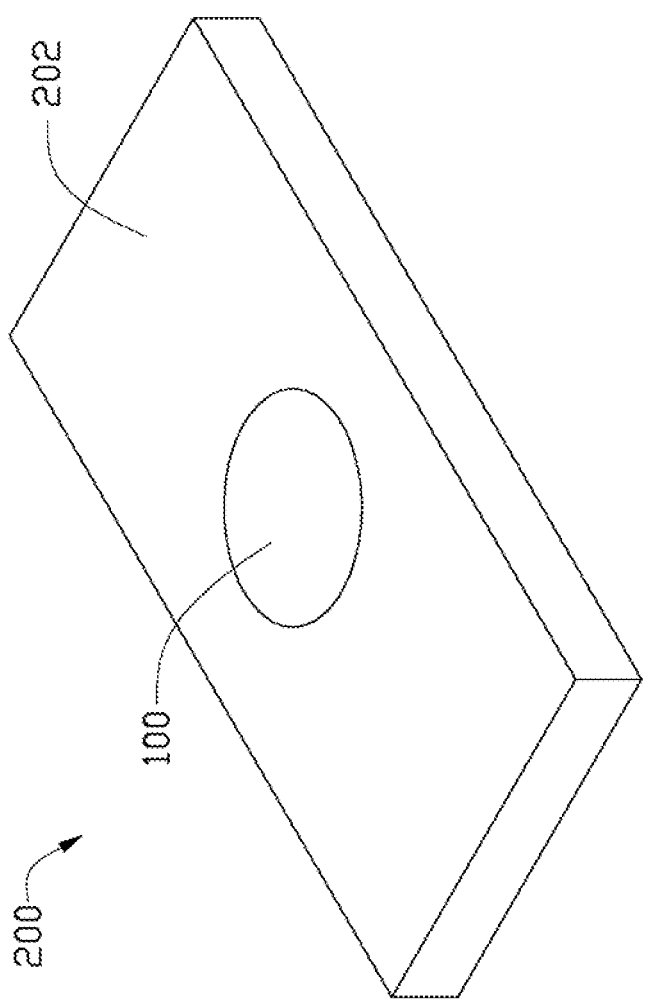
FIG. 1 is an isometric view of a portable electronic device in accordance with a first exemplary embodiment.

Referring to FIG. 1, a portable electronic device 200 is disclosed. The portable electronic device 200 includes a main body 202 and a rotation sensing device 100 set inside the main body 202. In the exemplary embodiment, the portable electronic device 200 is a mobile phone. The rotation sensing device 100 is mounted on the backside of the portable electronic device 200.

Figure 2:
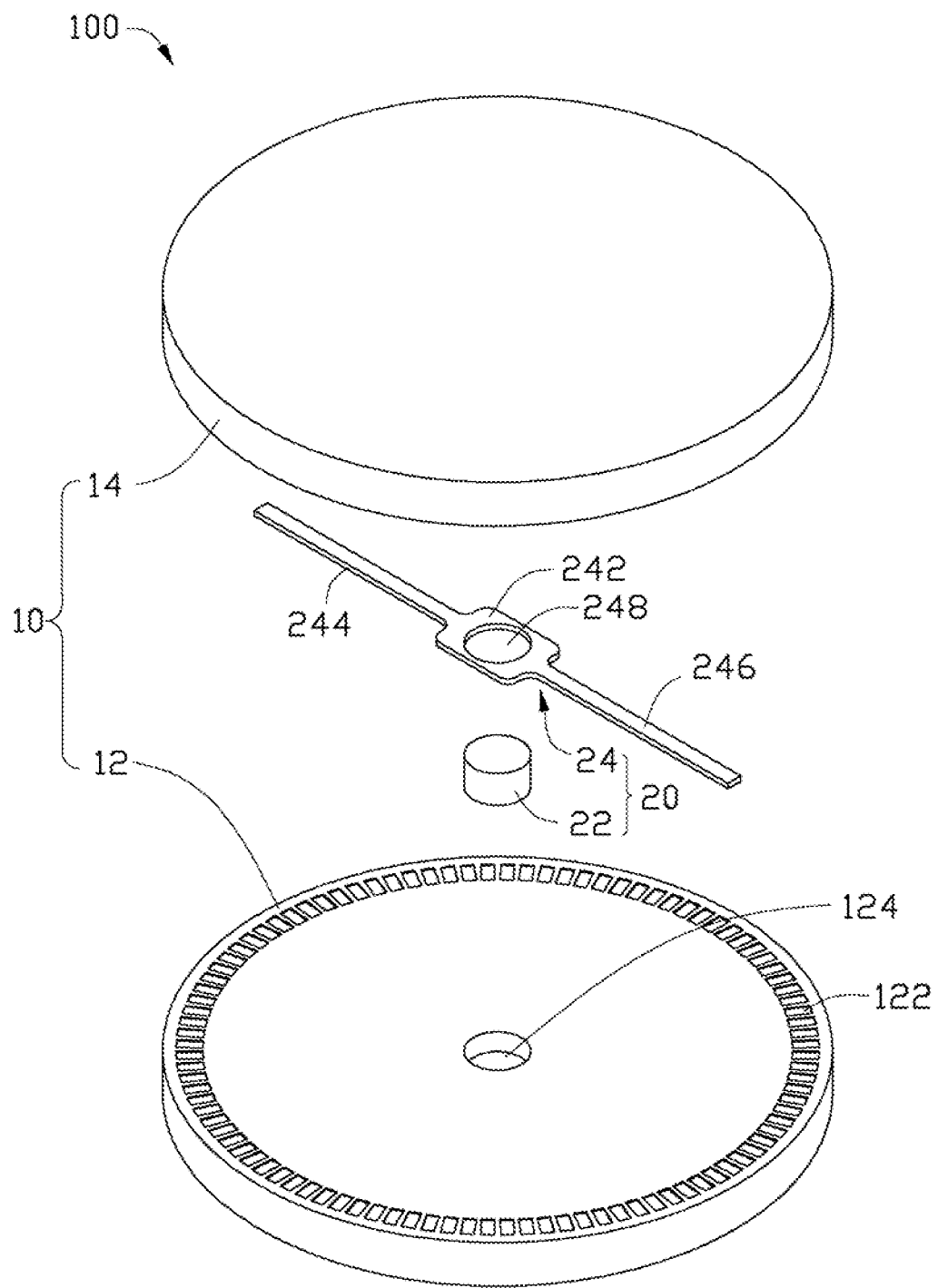
FIG. 2 is an exploded view of the portable electronic device of FIG. 1.
Figure 3:
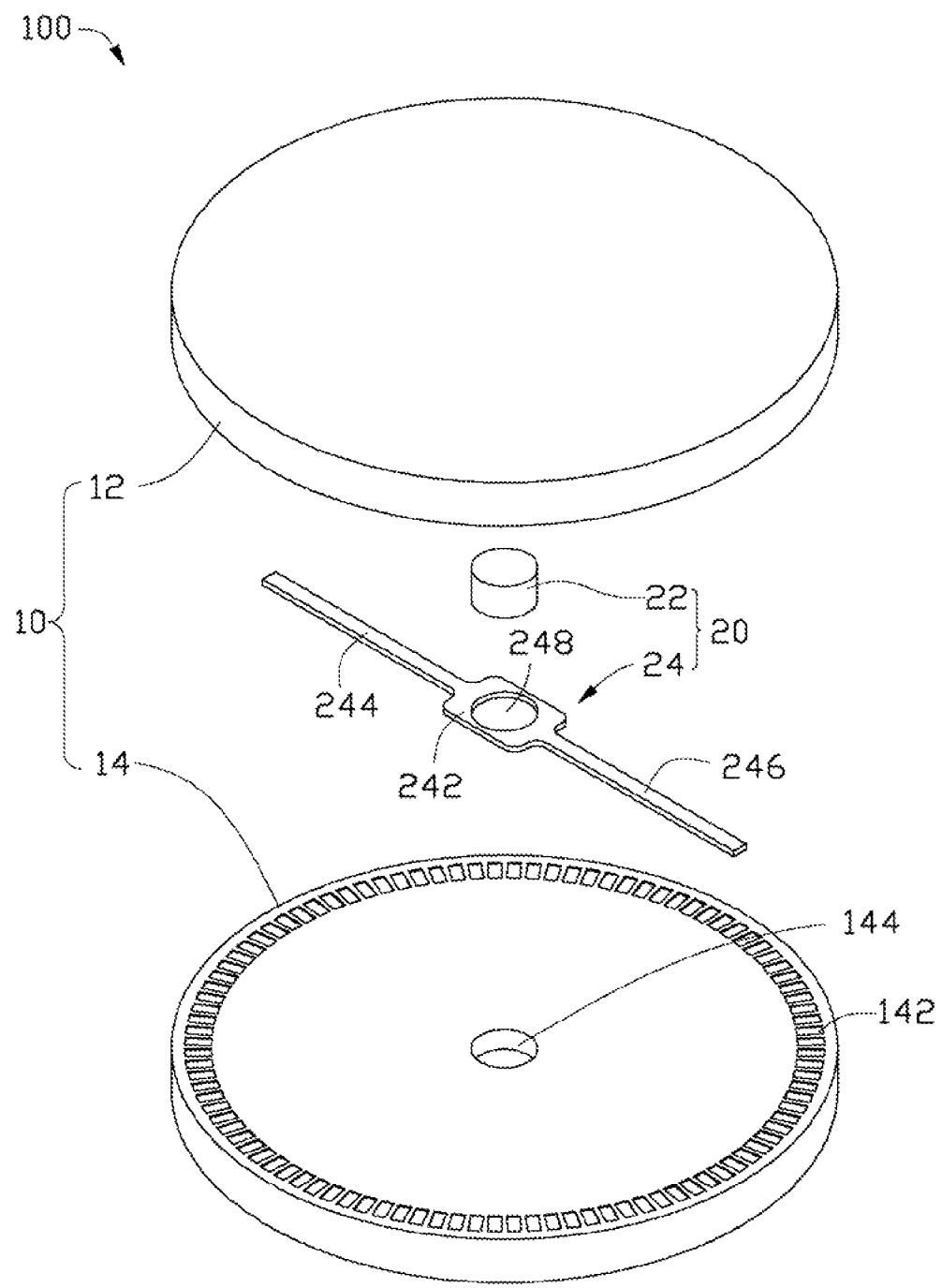
FIG. 3 is similar to FIG. 2, but viewed from another aspect.

Referring to FIGS. 2-3, the rotation sensing device 100 includes a capacitor module 10 and a pointing module 20.

The capacitor module 10 includes a lower substrate 12 and an upper substrate 14. In the exemplary embodiment, the lower substrate 12 is symmetrical to the upper substrate 14. The lower substrate 12 and the upper substrate 14 are circular and substantially flat. The lower substrate 12 includes a plurality bottom plates 122 mounted thereon. The bottom plates 122 are uniformity distributed into a circle. A first blind hole 124 is defined in the middle of the lower substrate 12.

The upper substrate 14 includes a plurality top plates 142 mounted thereon. The top plates 142 are uniformity distributed in a circle, and each of the top plates 142 is symmetrical to and corresponding with one of the bottom plates 122. A second blind hole 144 is defined in the middle of the upper substrate 14, and is coaxial to the first blind hole 124 of the lower substrate 12. In the exemplary embodiment, there are 100 bottom plates 122 and 100 top plates 142. Therefore, there is approximately 3.6° of arc between any two adjacent top of bottom plates.

The pointing module 20 is located between the top substrate 14 and the lower substrate 12, and includes an axle 22 and a pointer 24 rotatably connected to the axle 22. The diameter of the axle 22 is equal to the inner diameter of the first blind hole 124 and the inner diameter of the second blind hole 144 respectively.

The pointer 24 is located between the lower substrate 12 and the top substrate 14. The pointer 24 includes a connection portion 242, a first portion 244 and a second portion 246 opposite to the first portion 244. The first portion 244 and the second portion 246 protrude from opposite ends of the connection portion 242 respectively. An axle hole 248 is defined in the middle of the connection portion 242. The inner diameter of the axle hole 248 is equal to the diameter of the axle 22, so that the axle 22 passes through the axle hole 248 for rotatably connecting the pointer 24 to the axle 22. The distance between the center of the axle hole 248 and the end of the first portion 244 or the end of the second portion 248 is greater than the radius of the lower substrate 12. The width of the first portion 244 or the second portion 246 is equal to the distance between the bottom plate 122 and the top plate 142. In the exemplary embodiment, the pointer 24 is magnetic, the first portion 244 is configured for indicating the north pole (N pole) of the pointer 24, and the second portion 246 is configured for indicating the south pole (S pole) of the pointer 24.

Figure 4:
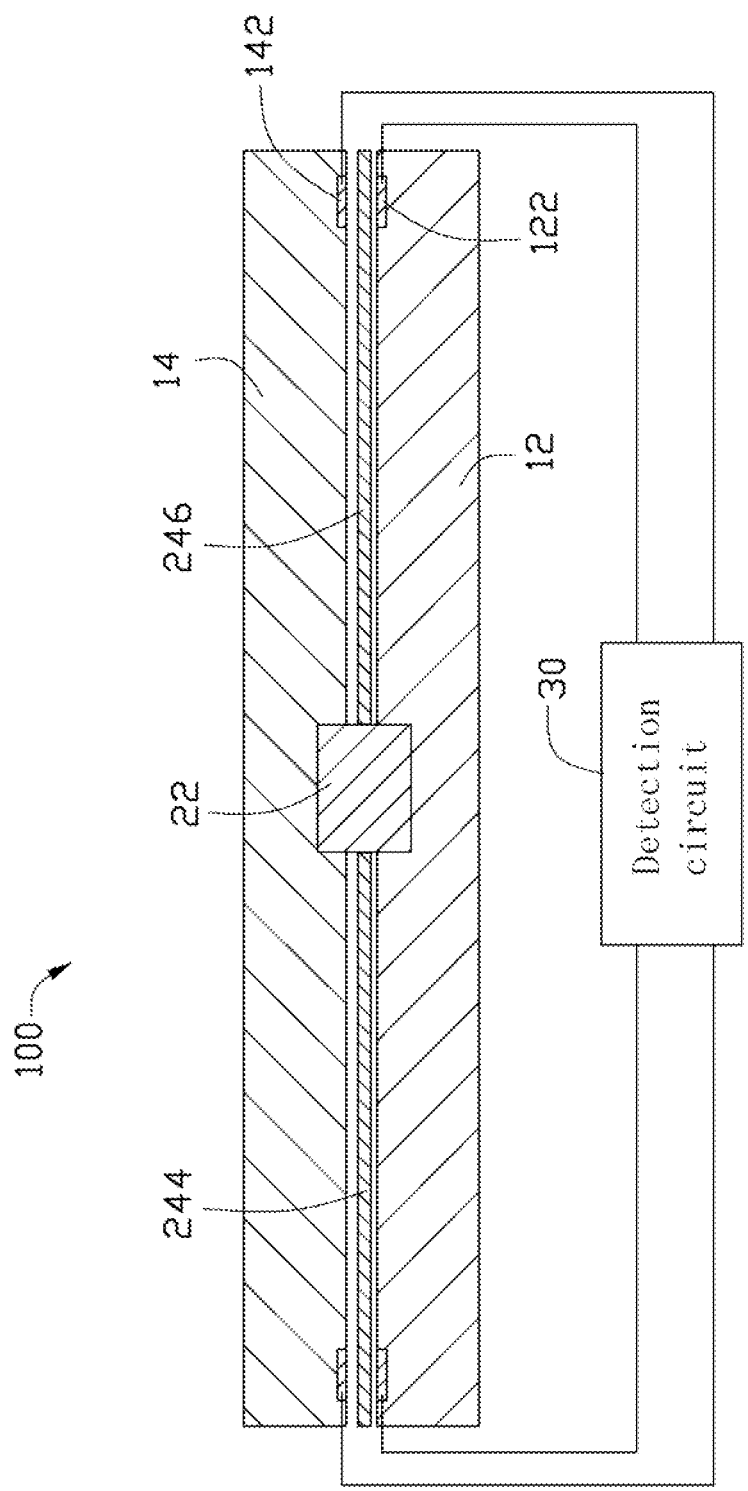
FIG. 4 is a sectional view of the portable electronic device of FIG. 2.

Referring to FIG. 4, when assembling the rotation sensing device 100, first one end of the axle 22 is inserted into the first blind hole 124, thereby fixing the axle 22 into the first blind hole 124. Second, the pointer 24 is rotatably connected to the axle 22 by the axle hole 248. Finally, another end of the axle 22 is inserted into the second blind hole 144, thereby fixing the axle 22 into the second blind hole 144. Accordingly, one of the bottom plates 122, one of the top plates 142, and the space between one of the bottom plates 122 and the top plates 142 form a flat capacitor. So, the rotation sensing device 100 includes a plurality of flat capacitors formed by the plurality of the bottom plates 122 and the top plates 142 and the space between the plurality of the bottom plates 122 and the top plates 142. Each of the flat capacitors has a same initial capacitance. The first portion 244 and the second portion 246 have an initial position between the bottom plates 122 and the top plates 142.

When the capacitor module 10 rotates relative to the pointer 24 or vice versa. That is, the pointer 24 rotates relative to the capacitor module 10. That is, the first portion 244 and the second portion 246 horizontally rotate in the space between the bottom plates 122 and the top plates 142 to change a current capacitance of the flat capacitor between one of the bottom plates 122 and one of the top plates 142 where the first portion 244 and the second portion 246 are currently located. The change of the capacitance relative to the initial capacitance produces a pulse.

The rotation sensing device 100 further includes a detection circuit 30. The detection circuit 30 electronically connects to the bottom plates 122 and the top plates 142. The detection circuit 30 is configured for detecting the pulses during the rotation of first portion 244 and the second portion 246, and determining a position change of the first portion 244 and the second portion 246 relative to the initial position according to the pulse, and determining a rotation orientation of the capacitor module 10 according to the determined position change of the first portion 244 and the second portion 246. For example, as previously mentioned, the distance between adjacent bottom or top plates is 3.6° of arc. Therefore, it the detection circuit 30 detects ten pulses, there has been a rotation angle of 36°, which triggers a corresponding movement of an object being controlled in a game being played on the device 200. Various angles of rotation are associated with various commands and need not be limited to turning or rotating a controlled object in a game.

When the motion sensing function is desired by the user they can activate the function and then must set an initial position of the capacitor module 10 by placing the portable electronic device 200 on a flat surface (or at least hold it flat and steady). Then the user can, for example play a game, and when they rotate the main body 202, the capacitor module 10 rotates with rotation of the main body 202. Because the pointer 24 is kept in its original position by the magnetic field, the capacitor module 10 rotates relative to the pointer 24. Thus, positions of the first portion 244 and the second portion 246 change causing changes in capacitance, which causes electrical pulses that can be read by the detection circuit. The pluses are interpreted as changes in orientation as a result of a degrees of rotation and associated commands are then executed. For example, if the device 200 is rotated clockwise 36 degrees, then an associated command might be to turn a car in a game right 36 degrees.

In another exemplary embodiment, the pointer 24 only includes a first portion 244. The first portion 244 is configured for indicating the south pole (S pole) of the pointer 24. The bottom plates 122 and the top plates 142 may be elliptical shape, square shape, etc. The distance between at least one end of the pointer 24 and the middle of the axes of the axle 22 is greater than that of between the bottom plates 122 and the middle of the axes of the axle 22, or that of between the top plates 142 and the middle of the axes of the axle 22, so that, at least one end of the pointer 24 locates between the bottom plates 122 and the top plates 142.

Figure 5:
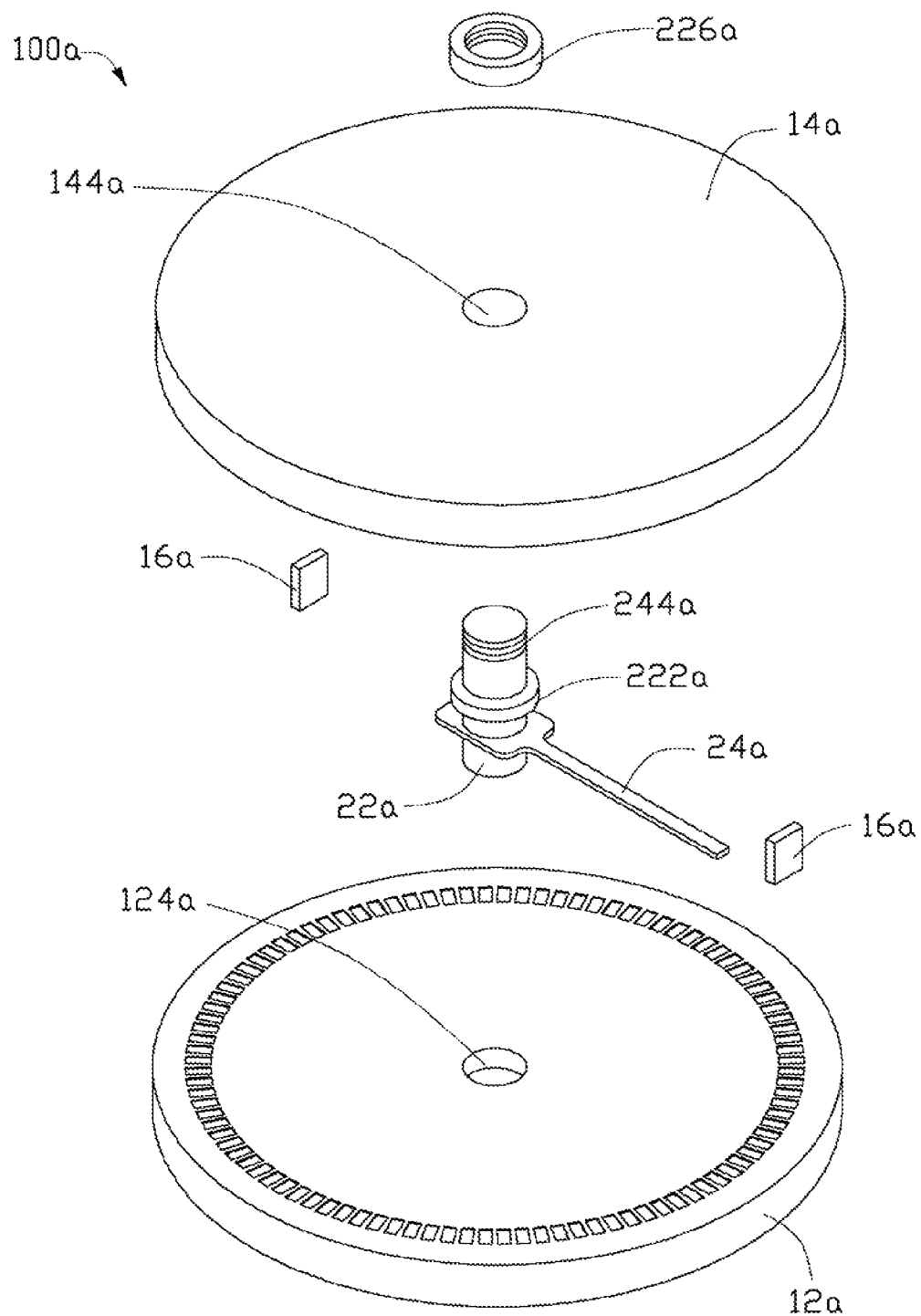
FIG. 5 is an exploded view of the portable electronic device in accordance with a second exemplary embodiment.
Figure 6:
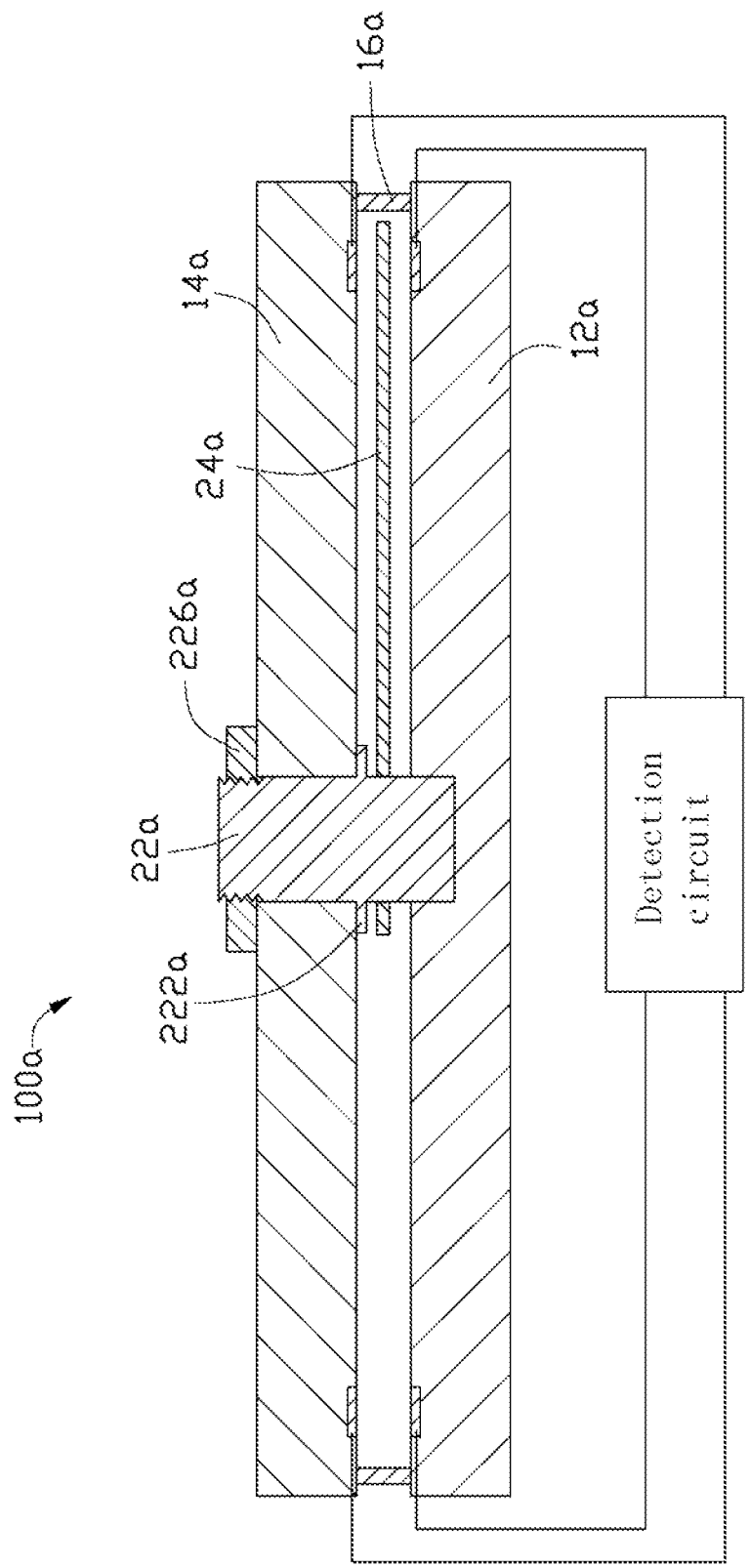
FIG. 6 is a sectional view of the portable electronic device of FIG. 5.

Referring to FIGS. 5-6, a rotation sensing device 100a in a second exemplary embodiment is provided. The axle 22a has a threaded end 244a adjacent to the upper substrate 14a. The axle 22a further includes a threaded bolt 226a, which is located above the upper substrate 14 and a ring 222a coiled on the surface of the axle 22a. One threaded end 244a of the axle 22a extends through the second blind hole 144a, and screws onto the threaded bolt 226a, so that, the upper substrate 14a is rotatably connected between the ring 222a and the threaded bolt 226a. The pointer 24a is fixed into the axle 22a, and another end of the axle 22a is rotatably inserted into the first blind hole 124a. The rotation sensing device 100a further includes two connection portions 16a. The two connection portions 16a are configured for fixedly connecting the upper substrate 14a to the lower substrate 12a, so that, the upper substrate 14a and the lower substrate 12a are rotatable relative to the pointer 24a and the axle 22a. Then, the rotation sensing device 100a is assembled into the portable electronic device, the axle 22a is fixed into the main body 202, and the upper substrate 14a and the lower substrate 12a are rotatably connected to the main body 202. When using the portable electronic device, the upper substrate 14a and the lower substrate 12a rotate relative to the main body 202, the axle 22a and the pointer 24a, and thus the user can operate the portable electronic device 200 to accurately control displayed objects according to the rotation orientation of the capacitor module 10.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A rotation sensing device comprising:
   a capacitor module comprising an upper substrate and a lower substrate; wherein the upper substrate comprises a plurality top plates mounted thereon, and the lower substrate comprises a plurality bottom plates mounted thereon, each bottom plate corresponding to one of the top plates;
   a pointing module comprising a pointer rotatably set between the upper substrate and the lower substrate; wherein the pointer is magnetic and comprises a first portion, the first portion has an initial position between the bottom a plate and a corresponding top plate; and
   a detection circuit electronically connected to the top plates and the bottom plates, and configured for detecting pulses caused by a change in the capacitance resulting from movement of the capacitor module and determining a position change of the first portion relative to the initial position according the detected pulses, and determining a rotation orientation of the capacitor module according to the determined position change.

2. The rotation sensing device as described in claim 1, wherein the pointing module further comprises an axle, a first blind hole is defined in the middle of the lower substrate, a second blind hole is defined in the middle of the upper substrate, one end of the axle is inserted into the first blind hole, and another end of the axle is inserted into the second blind hole.

3. The rotation sensing device as described in claim 2, wherein the pointer further comprises a connection portion and a second portion, the connection portion comprises a axle hole, the axle is rotatably connected to the connection portion by the axle hole.

4. The rotation sensing device as described in claim 1, wherein the pointing module further comprises an axle, the axle comprises a threaded end adjacent to the upper substrate, a threaded bolt located above the upper substrate and a ring coiled on the surface of the axle, one threaded end of the axle extends through the second blind hole, and screws onto the threaded bolt, and another end of the axle is rotatably inserted into the first blind hole.

5. The rotation sensing device as described in claim 4, wherein the rotation sensing device further comprises two connection portions for fixedly connecting the upper substrate to the lower substrate.

6. The rotation sensing device as described in claim 3, wherein the top plates and the bottom plates are uniformity distributed in a circle.

7. A portable electronic device comprising:
   a main body; and
   a rotation sensing device set inside the main body, the rotation device comprising a capacitor module, wherein, the capacitor module comprises a upper substrate and a lower substrate; the upper substrate comprises a plurality top plates mounted thereon, the lower substrate comprises a plurality bottom plates mounted thereon, each bottom plate corresponding to one of the top plates;
   a pointing module comprising a pointer rotatably set between the upper substrate and the lower substrate; wherein the pointer is magnetic and comprises a first portion, when the pointer rotates relative to the capacitor module, the first portion has an initial position between a bottom plate and a corresponding top plate; and
   a detection circuit electronically connected to the top plates and the bottom plates, and configured for detecting pulses caused by a change in the capacitance resulting from movement of the capacitor module, and determining a position change of the first portion relative to the initial position according the detected pulses, and determining a rotation orientation of the capacitor module according to the determined position change.

8. The portable electronic device as described in claim 7, wherein the pointing module further comprises an axle, a first blind hole is defined in the middle of the lower substrate, a second blind hole is defined in the middle of the upper substrate, one end of the axle is inserted into the first blind hole, and another end of the axle is inserted into the second blind hole.

9. The portable electronic device as described in claim 8, wherein the pointer further comprises a connection portion and a second portion, the connection portion comprises a axle hole, the axle is rotatably connected to the connection portion by the axle hole.

10. The portable electronic device as described in claim 7, wherein the pointing module further comprises an axle, the axle comprises a threaded end adjacent to the upper substrate, a threaded bolt located above the upper substrate and a ring coiled on the surface of the axle, one threaded end of the axle extends through the second blind hole, and screws onto the threaded bolt, and another end of the axle is rotatably inserted into the first blind hole.

11. The portable electronic device as described in claim 10, wherein the rotation sensing device further comprises two connection portions which are configured for fixedly connecting the upper substrate to the lower substrate.

12. The portable electronic device as described in claim 9, wherein the top plates and the bottom plates are uniformity distributed in a circle.

* * * * *